(12) United States Patent
Arase et al.

(10) Patent No.: US 8,476,098 B2
(45) Date of Patent: Jul. 2, 2013

(54) METHOD FOR FABRICATING SOLAR CELL COMPRISING CONDENSER LENS AND PHOTOELECTRIC CONVERSION ELEMENT

(71) Applicant: Panasonic Corporation, Osaka (JP)

(72) Inventors: Hidekazu Arase, Hyogo (JP); Tohru Nakagawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/724,938

(22) Filed: Dec. 21, 2012

(65) Prior Publication Data

US 2013/0122633 A1    May 16, 2013

Related U.S. Application Data

(63) Continuation of application No. PCT/JP2012/003848, filed on Jun. 13, 2012.

(30) Foreign Application Priority Data

Jun. 16, 2011  (JP) .................................. 2011-133981

(51) Int. Cl.
  *H01L 21/00*   (2006.01)
  *H01L 31/042*  (2006.01)
(52) U.S. Cl.
  USPC .................. 438/69; 125/E33.068; 125/98
(58) Field of Classification Search
  USPC ................... 438/69; 257/E33.068, 98
  See application file for complete search history.

(56) References Cited

U.S. PATENT DOCUMENTS

| 7,730,610 B2 * | 6/2010 | Nakagawa et al. ............. 29/831 |
| 8,178,154 B2 * | 5/2012 | Arase ............................ 427/58 |
| 8,187,667 B2 * | 5/2012 | Arase ............................ 427/58 |
| 8,394,458 B2 * | 3/2013 | Arase ............................ 427/260 |
| 2005/0164485 A1 | 7/2005 | Onozawa |
| 2007/0161152 A1 | 7/2007 | Onozawa |
| 2010/0266769 A1 | 10/2010 | Arase et al. |

FOREIGN PATENT DOCUMENTS

| JP | 58-068988 A | 4/1983 |
| JP | 2005-209939 A | 8/2005 |
| JP | 2005-229042 A | 8/2005 |
| JP | 4149507 B2 | 9/2008 |
| WO | WO-2007/037381 A1 | 4/2007 |
| WO | WO-2010/058516 A1 | 5/2010 |

OTHER PUBLICATIONS

International Search Report issued in International Patent Application No. PCT/JP2012/003848 dated Jul. 10, 2012.

\* cited by examiner

*Primary Examiner* — William D Coleman
*Assistant Examiner* — Christine Enad
(74) *Attorney, Agent, or Firm* — McDermott Will & Emery LLP

(57) ABSTRACT

The purpose of the present invention is to provide a method for disposing a photoelectric conversion element accurately on the focal point of a condenser lens.
The method of the present invention comprises a step of forming a focal point on the reverse surface of the condenser lens to be a hydrophilic region, a step of removing the remained photoresist to obtain the condenser lens having the reverse surface where the hydrophilic region is surrounded by a water-repellent region formed of the fluoroalkylsilane film and a step of disposing the photoelectric conversion element on the hydrophilic region to obtain the solar cell comprising the condenser lens and the photoelectric conversion element.

8 Claims, 11 Drawing Sheets

804

805  805

804

METHOD FOR FABRICATING SOLAR CELL COMPRISING CONDENSER LENS AND PHOTOELECTRIC CONVERSION ELEMENT

This is a continuation of International Application No. PCT/JP2012/003848, with an international filing date of Jun. 13, 2012, which claims priority of Japanese Patent Application No. 2011-133981, filed on Jun. 16, 2011, the contents of which are hereby incorporated by reference.

TECHNICAL FIELD

The present invention relates to a method for fabricating a solar cell comprising a condenser lens and a photoelectric conversion element. More particularly, the present invention relates to a method for disposing a photoelectric conversion element accurately on the focal point of the condenser lens.

BACKGROUND ART

FIG. 9 shows a solar cell disclosed in Patent Literature 1. This solar cell comprises a photoelectric conversion element 901 and a condenser lens 902. The sunlight passes through the condenser lens 902 to be converged. The photoelectric conversion element 901 is irradiated with the converged sunlight. This irradiation of the sunlight generates electric power.

Patent Literature 2 discloses a method for disposing an element. This method is briefly described below. First, as shown in FIG. 10A, prepared is a substrate 10 comprising a plurality of hydrophilic regions 11 and a water-repellent region 12 surrounding the plurality of hydrophilic regions 11. Then, as shown in FIG. 10B, an element to be disposed on the substrate 10 is dispersed in a solvent 30 which is substantially insoluble in water to prepare an element-containing liquid 60. One surface of the element 40 is hydrophilic and can be joined onto the substrate 10. The other surfaces of the element are water-repellent.

Then, as shown in FIG. 11A, water 20 is disposed on the plurality of hydrophilic regions 11 using a first squeegee 51. Subsequently, the element-containing liquid 60 was applied using a second squeegee 52 to bring the element-containing liquid 60 into contact with the hydrophilic region 11. The element 40 moves into the inside of water 21 disposed on the hydrophilic region 11. Then, water and the solvent which is contained in the element-containing liquid 60 are removed to fix the element 40 to the hydrophilic region 11.

CITATION LIST

Patent Literature

PTL 1: Japanese Examined Patent Publication No. 58-68988
PTL 2: U.S. Pat. No. 7,730,610 (corresponding to Japanese Patent No. 4149507)
PTL 3: International publication No. 2010/058516

SUMMARY OF INVENTION

Technical Problem

In a solar cell comprising a condenser lens, it is required to dispose a photoelectric conversion element accurately on the focal point of the condenser lens. Otherwise, the photoelectric conversion efficiency of the solar cell decreases significantly.

The purpose of the present invention is to provide a method for disposing a photoelectric conversion element accurately on the focal point of a condenser lens.

Solution to Problem

A method for fabricating a solar cell comprising a condenser lens 100 and a photoelectric conversion element 400, the method comprising steps of:

a step (a) of preparing the condenser lens 100 comprising a convex part on the obverse surface thereof and a flat reverse surface;

a step (b) of forming an alkylsilane film 801 on the obverse surface of the condenser lens 100 and forming a fluoroalkylsilane film 802 on the reverse surface of the condenser lens 100;

a step (c) of immersing the condenser lens 100 in a solution containing aminoalkylsilane to form an aminoalkylsilane film 803 on the fluoroalkylsilane film 802; wherein the aminoalkylsilane film 803 is not formed on the alkylsilane film 801;

a step (d) of forming a photoresist 804 on the aminoalkylsilane film 803;

a step (e) of irradiating the obverse surface of the condenser lens 100 with light 805 to expose a part of the photoresist 804 located at a focal point on the photoresist 804 to light through a focal point on the reverse surface of the condenser lens 100, a focal point on the fluoroalkylsilane film 802, and a focal point on the aminoalkylsilane film 803;

a step (f) of removing the exposed part of the photoresist 804 to form an opening 806 where the focal point of the aminoalkylsilane film 803 is exposed;

a step (g) of removing a part of the aminoalkylsilane film 803 located at the focal point of the aminoalkylsilane film 803 and a part of the fluoroalkylsilane film 802 located at the focal point of the fluoroalkylsilane film 802 by an oxygen plasma treatment or an ozone plasma treatment through the opening 806 so as to cause the focal point on the reverse surface of the condenser lens 100 to be a hydrophilic region 110;

a step (h) of removing the remained photoresist 804 to obtain the condenser lens 100 having the reverse surface where the hydrophilic region 110 is surrounded by a water-repellent region 120 formed of the fluoroalkylsilane film 802; and a step (i) of disposing the photoelectric conversion element 400 on the hydrophilic region 110 to obtain the solar cell comprising the condenser lens 100 and the photoelectric conversion element 400.

The term "disposition" in the instant specification includes a meaning of "mounting".

Advantageous Effects of Invention

The present invention provides a method for disposing a photoelectric conversion element accurately on the focal point of a condenser lens.

DESCRIPTION OF EMBODIMENTS

Figure 1A:
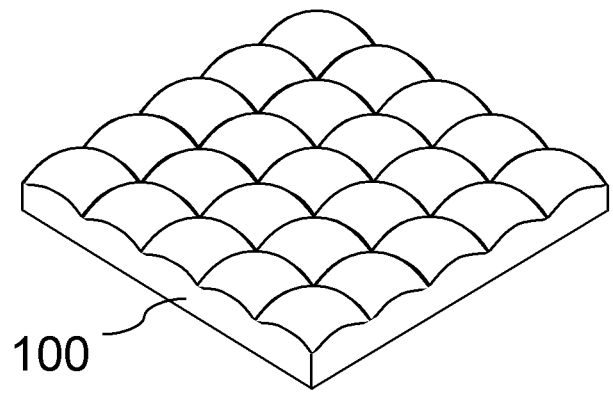
FIG. 1A shows a perspective view of an obverse surface of a condenser lens 100.

An embodiment according to the present invention is described below with reference to the drawings. In the drawings, hatching can be omitted to facilitate the understanding of the instant specification.

(Step A)

Figure 1B:
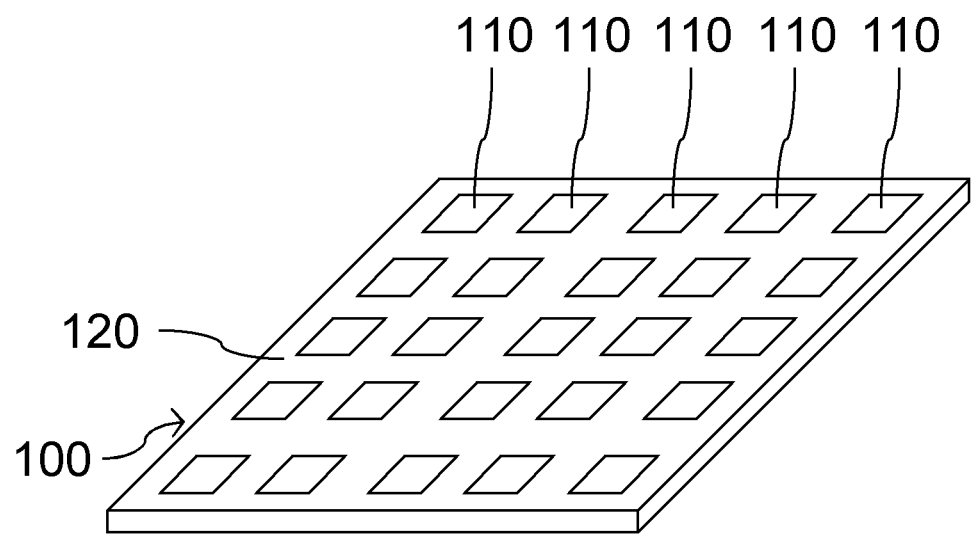
FIG. 1B shows a perspective view of a reverse surface of the condenser lens 100.
Figure 2A:
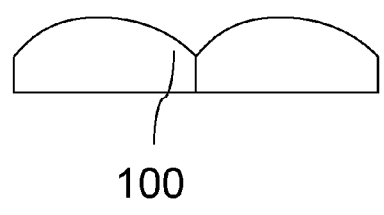
FIG. 2A shows one step of a method for fabricating the condenser lens 100 according to the present embodiment.

First, as shown in FIG. 2A, a condenser lens 100 is prepared. FIG. 1A shows a perspective view of an obverse surface of the condenser lens 100. The obverse surface of the condenser lens 100 is irradiated with incident light. As shown in FIG. 1A, the condenser lens 100 comprises a convex part on the obverse surface thereof. FIG. 1B shows a perspective view of a reverse surface of the condenser lens 100. As shown in FIG. 1B, the reverse surface of the condenser lens 100 is flat. The condenser lens 100 comprises a hydrophilic region 110 and a water-repellent region 120 on the reverse surface thereof. Preferably, a plurality of the hydrophilic regions 110 are provided. The water-repellent region 120 surrounds the hydrophilic region 110. Note that the obverse surface of the condenser lens 100 (i.e., the surface irradiated with the incident light such as the sunlight) is not shown in FIG. 1B.

As far as the sunlight passes through the condenser lens 100, a material of the condenser lens 100 is not limited. An example of the material of the condenser lens 100 is glass or resin. More particularly, the condenser lens 100 may be made of sheet glass used in a photovoltaic power generation module. Instead of this, polymethylmethacrylate or polycarbonate of weather-resistant grade may be used. Two or more kinds of materials may be used for the condenser lens 100. An ultra-violet absorber may be added to the condenser lens 100 to prevent deterioration of the condenser lens 100 and the photoelectric conversion element 401 by the ultra-violet rays.

The size of the convex part of the condenser lens 100 is determined in accordance with the photoelectric conversion element 400. As an example, it is desirable that condenser lens 100 has a diameter of approximately 5 millimeters to 50 millimeters, a thickness of approximately 3 millimeters to 20 millimeters, and an index of refraction of approximately 1.1 to 2.0 when a light receiving side of photoelectric conversion element 400 is 0.5 millimeter square.

The obverse surface of the condenser lens 100 is irradiated with light. It is preferable that it is irradiated with sunlight. As shown in FIG. 7B, the reverse surface of the condenser lens 100 is in contact with the photoelectric conversion element 400. The light is converged on the photoelectric conversion element 400 with the condenser lens 100.

(Step B)

A method for forming a hydrophilic region 110 and a water-repellent region 120 on the reverse surface of the condenser lens 100 is described below with reference to FIG. 2A to FIG. 2E and FIG. 3A to FIG. 3E.

FIG. 2A to FIG. 2E and FIG. 3A to FIG. 3E are cross-sectional views showing a method for forming the hydrophilic region 110 and the water-repellent region 120 on the reverse surface of the condenser lens 100.

Figure 2D:
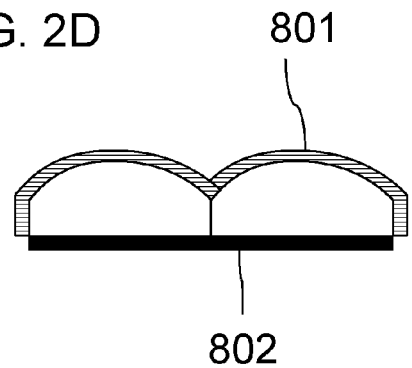
FIG. 2D shows one step of the method for fabricating the condenser lens 100 according to the present embodiment, subsequent to the step shown in FIG. 2C.
Figure 2B:
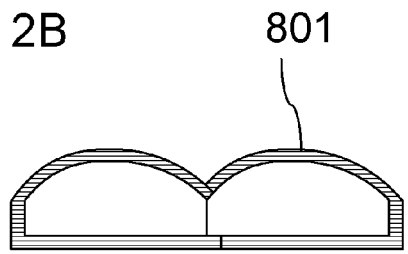
FIG. 2B shows one step of the method for fabricating the condenser lens 100 according to the present embodiment, subsequent to the step shown in FIG. 2A.

As shown in FIG. 2B, the condenser lens 100 is immersed in a solution where alkyl trichlorosilane or alkyl trialkoxy silane is dissolved. An example of the alkyl trichlorosilane is octyl trichlorosilane. An example of the alkyl trialkoxy silane is octyl trimethoxysilane or octyl triethoxysilane. In this way, both of the obverse and reverse surfaces are completely coated by an alkylsilane film 801.

Here, a method for coating the condenser lens 100 with the alkylsilane film 801 is described in detail.

The condenser lens 100 is immersed in chloroform, aromatic hydrocarbon, alkane, alcohol, silicone oil, or mixture thereof containing silane coupling agent (concentration: 1 to 3% by volume) having an alkyl chain. The silane coupling agent having an alkyl group is represented by a general formula: $CH_3(CH_2)_nSiX_3$. The character "n" represents a natural number of not more than 20. The character "X" represents a halogen (preferably CO or an alkoxy group. An example of the silane coupling agent is $CH_3(CH_2)_7SiCl_3$ or $CH_3(CH_2)_2SiCl_3$. It is preferable that the condenser lens 100 has active hydrogen on the surface thereof.

After the immersion, the condenser lens 100 is washed using a solvent. In this way, the condenser lens 100 is coated by an alkyl group such as an octyl group.

Figure 2E:
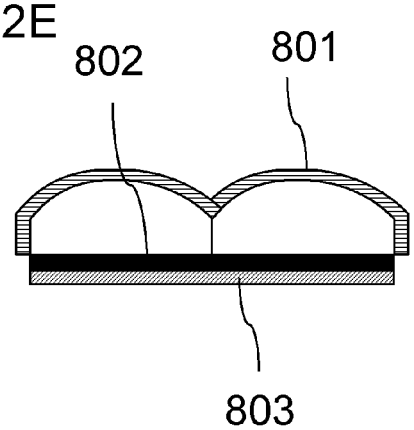
FIG. 2E shows one step of the method for fabricating the condenser lens 100 according to the present embodiment, subsequent to the step shown in FIG. 2D.
Figure 2C:
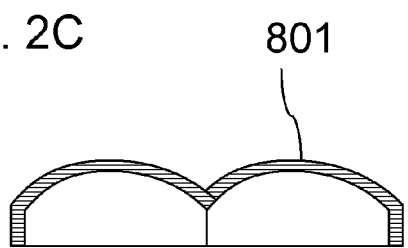
FIG. 2C shows one step of the method for fabricating the condenser lens 100 according to the present embodiment, subsequent to the step shown in FIG. 2B.

Then, as shown in FIG. 2C, the alkylsilane film 801 coating the reverse surface of the condenser lens 100 is subjected to a plasma treatment under an atmosphere of oxygen or ozone to remove a part of the alkylsilane film 801. In this way, the reverse surface of the condenser lens 100 is exposed.

Subsequently, as shown in FIG. 2D, the condenser lens 100 is immersed in a solution where fluoroalkyl-trichlorosilane or fluoroalkyl-trialkoxysilane is dissolved. An example of the fluoroalkyl-trichlorosilane is heptadecafluoro-octylethyl-trichlorosilane. An example of the fluoroalkyl-trialkoxysilane is heptadecafluoro octyl ethyl trimethoxysilane or heptadecafluoro-octylethyltriethoxysilane. In this way, the reverse surface of the condenser lens 100 is coated by a fluoroalkylsilane film 802. On the contrary, the obverse surface of the condenser lens 100 is not coated by the fluoroalkylsilane film 802, since the obverse surface of the condenser lens 100 does not have active hydrogen, which reacts with the fluoroalkylsilane, due to the alkylsilane film 801.

A method for coating the reverse surface of the condenser lens 100 with the fluoroalkylsilane film 802 is described below in more detail.

The fluoroalkylsilane film 802 is formed using a silane coupling agent having a fluoroalkyl chain.

A method for forming the fluoroalkylsilane film 802 using the silane coupling agent is described below. The condenser lens 100 is immersed in chloroform, perfluoroalkane, aromatic hydrocarbon, alkane, alcohol, silicone oil, or mixture thereof containing the silane coupling agent (concentration: 1 to 3% by volume) having the fluoroalkyl chain. The silane coupling agent having the fluoroalkyl group is represented by a general formula: $CF_3(CF_2)_n(CH_2)_nSiX_3$. The character "n" represents a natural number of not more than 10. The character "m" represents a natural number of not more than 10. The character "X" represents a halogen (preferably, Cl) or an alkoxy group. An example of the silane coupling agent is $CF_3(CF_2)_7C_2H_4SiCl_3$ or $CF_3C_2H_4SiCl_3$.

After the immersion, the condenser lens 100 is washed using a solvent. In this way, the reverse surface of the condenser lens 100 is coated by the fluoroalkyl group such as the hexadecafluoro octyl ethyl group.

The fluoroalkylsilane film 802 may be formed by an ink jet method, a screening print method, a letterpress method, an intaglio printing method, or a microcontact print method.

(Step C)

Furthermore, as shown in FIG. 2E, the condenser lens 100 is immersed in a solution where aminoalkylsilane is dissolved. An example of the aminoalkylsilane is aminopropyl triethoxysilane or aminopropyltrimethoxysilane. The present inventors have discovered that this immersion allows only the reverse surface (i.e., the surface coated by the fluoroalkylsilane film 802) of the condenser lens 100 to be hydrophilic. On the contrary, this immersion does not allow the obverse surface of the condenser lens 100 to be hydrophilic. In this way, an aminoalkylsilane film 803 is formed only on the reverse surface of the condenser lens 100. In other words, the reverse surface of the condenser lens 100 comprises the fluoroalkylsilane film 802 and the aminoalkylsilane film 803. The fluoroalkylsilane film 802 is interposed between the condenser lens 100 and the aminoalkylsilane film 803.

This enables the positive photoresist 804 to be applied to the reverse surface of the condenser lens 100 uniformly in a step shown in FIG. 3A, which is described later. In addition, the positive photoresist 804 is not formed on the obverse surface of the condenser lens 100, since the water repellency of the obverse surface of the condenser lens 100 is maintained. In other words, the obverse surface of the condenser lens 100 does not comprise the aminoalkylsilane film 803.

A method for forming the aminoalkylsilane film 803 on the fluoroalkylsilane film 802 is described below in more detail.

The condenser lens 100 comprising the fluoroalkylsilane film 802 is immersed in aromatic hydrocarbon, alkane, alcohol, or mixture thereof containing the silane coupling agent (concentration: 1 to 3% by volume) having an amino alkyl chain. An example of the silane coupling agent having the amino alkyl group is $NH_2(CH_2)_3Si(OCH_3)_3$, $NH_2(CH_2)_3Si(OCH_2CH_3)_3$, $NH_2(CH_2)_2NH(CH_2)_3Si(OCH_3)_3$, or $NH_2(CH_2)_2NH(CH_2)_3Si(OCH_2CH_3)_3$.

After the immersion, the condenser lens 100 is washed using a solvent. In this way, the fluoroalkylsilane film 802 is coated by the amino alkyl group such as an amino propyl group.

(Step D)

Figure 3A:
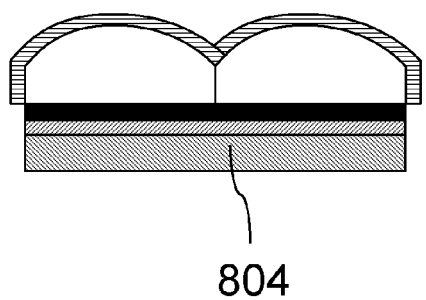
FIG. 3A shows one step of the method for fabricating the condenser lens 100 according to the present embodiment, subsequent to the step shown in FIG. 2E.

Then, as shown in FIG. 3A, a positive photoresist 804 is formed on the reverse surface of the condenser lens 100.

(Step E)

Figure 3B:
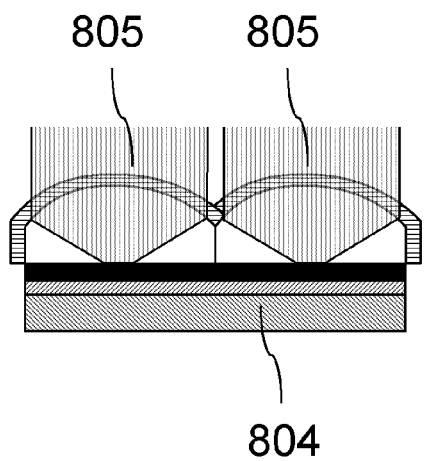
FIG. 3B shows one step of the method for fabricating the condenser lens 100 according to the present embodiment, subsequent to the step shown in FIG. 3A.

As shown in FIG. 3B, the obverse surface of the condenser lens 100 is irradiated with substantially-parallel light 805. The substantially-parallel light 805 is converged by the condenser lens 100. The converged substantially-parallel light 805 travels to the positive photoresist 804 through the focal point located on the fluoroalkylsilane film 802 and through the focal point located on the aminoalkylsilane film 803. In this way, a part of the positive photoresist 804 covering the focal point of the condenser lens 100 is exposed to light. In other words, the part of the positive photoresist 804 located at the focal point on positive photoresist 804 is exposed to light. Note that the thicknesses of the films 801 to 803 are emphasized in the drawings. In other words, the films 801 to 803 are much thinner than the condenser lens 100.

(Step F)

Figure 3C:
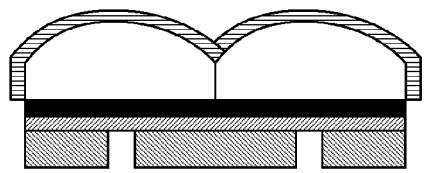
FIG. 3C shows one step of the method for fabricating the condenser lens 100 according to the present embodiment, subsequent to the step shown in FIG. 3B.

Subsequently, as shown in FIG. 3C, the positive photoresist 804 which has been exposed to light is removed using a photoresist developing solution containing organic amine. In this way, the positive photoresist 804 is provided with an opening 806, and a region which will be the hydrophilic region 110 later is formed at the focal point of the condenser lens 100.

(Step G)

Figure 3D:
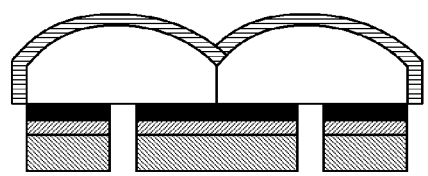
FIG. 3D shows one step of the method for fabricating the condenser lens 100 according to the present embodiment, subsequent to the step shown in FIG. 3C.

Then, as shown in FIG. 3D, the part of the aminoalkylsilane film 803 exposed on the opening 806 and the part of the fluoroalkylsilane film 802 exposed on the opening 806 are removed in this order. The parts of the aminoalkylsilane film 803 and the fluoroalkylsilane film 802 are subjected to a plasma treatment under an atmosphere of oxygen or ozone to remove them. In this way, a part of the reverse surface of the condenser lens 100 is exposed on the opening 806. This plasma treatment causes the part of the reverse surface of the condenser lens 100 exposed on the openings 806 to be hydrophilic.

(Step H)

Figure 3E:
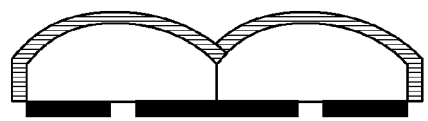
FIG. 3E shows one step of the method for fabricating the condenser lens 100 according to the present embodiment, subsequent to the step shown in FIG. 3D.

As shown in FIG. 3E, all of the positive photoresist 804 are removed with acetone or N-methylpyrrolidone.

In this way, the hydrophilic region 110 surrounded by the fluoroalkylsilane film 802 is formed at the focal point of the condenser lens 100. The fluoroalkylsilane film 802 serves as the water-repellent region 120.

The wettability of a solid surface with respect to water is related not only to the surface energy of the solid but also the surface tension of the water. The specific value of the surface energy of the hydrophilic solid is, preferably, not less than 40 mJ/m$^2$. It is more preferable that it is not less than 60 mJ/m$^2$ and not more than 100 mJ/m$^2$. The specific value of the surface energy of the water-repellent solid is, preferably, not less than 5 mJ/m$^2$ and less than 40 mJ/m$^2$. It is more preferable that it is not less than 5 mJ/m$^2$ and not more than 25 mJ/m$^2$.

Here, the hydrophilic region 110 is described in more detail.

The wettability of the hydrophilic region 110 with respect to water is higher than that of the water-repellent region 120.

The shape of the hydrophilic region 110 is determined according to the shape of the photoelectric conversion element 400 to be disposed on the hydrophilic region 110. The shape of hydrophilic region 110 includes, for example, a polygonal shape such as a triangle, a quadrangle, or a hexagon, or a circular or elliptical shape. The hydrophilic region 110 preferably has the same shape as a predetermined surface of the photoelectric conversion element 400 to be disposed (the predetermined surface faces the substrate when disposed on the substrate). The phrase "having the same shape" means that the shape of the predetermined surface of the photoelectric conversion element 400 to be disposed (that faces the substrate when disposed on the substrate) and the shape of the hydrophilic region 110 are in a congruent or similar relationship in a mathematical sense.

S1 denotes the area of the surface of the photoelectric conversion element 400 which faces the substrate when the photoelectric conversion element 400 is disposed on the substrate. S2 denotes the area of one component-disposing area 110. The value of S2/S1 is preferably not less than 0.64 and not more than 1.44. When the value of S2/S1 is smaller than 0.64, the hydrophilic region 110 has a significantly small amount of water, which reduces the probability of disposing the photoelectric conversion element 400 thereon. When the value of S2/S1 is greater than 1.44, the hydrophilic region 110 has significantly excess water. This causes a plurality of the photoelectric conversion element 400 to be disposed in one hydrophilic region 111.

The shape of the hydrophilic region 110 may be determined in accordance with a shape of a light-shielding filter (not shown) interposed between the light source of the substantially-parallel light 805 and the condenser lens 100. The area of the hydrophilic region 110 is determined on the basis of the distance between the light source and the condenser lens 100 and on the basis of the integrated exposure amount of the substantially-parallel light 805.

(Step I)

The photoelectric conversion element 400 is disposed on the hydrophilic region 110. The photoelectric conversion element 400 may be disposed on the hydrophilic region 110 with an automatic mounting machine. Alternatively, the photoelectric conversion element 400 may be disposed on the hydrophilic region 110 in accordance with the method disclosed in Patent Literature 3. The method disclosed in Patent Literature 3 comprises the following three steps (I1), (I2), and (I3). See FIG. 4A to FIG. 5D and the description thereof in Patent Literature 3, if necessary.

FIG. 6A, FIG. 6B, FIG. 7A, and FIG. 7B show a method for disposing the photoelectric conversion element 400 on the reverse surface of the condenser lens 100. In these four drawings, note that the convex structure formed on the obverse surface of the condenser lens is not illustrated.

(Step I1)

Figure 6A:
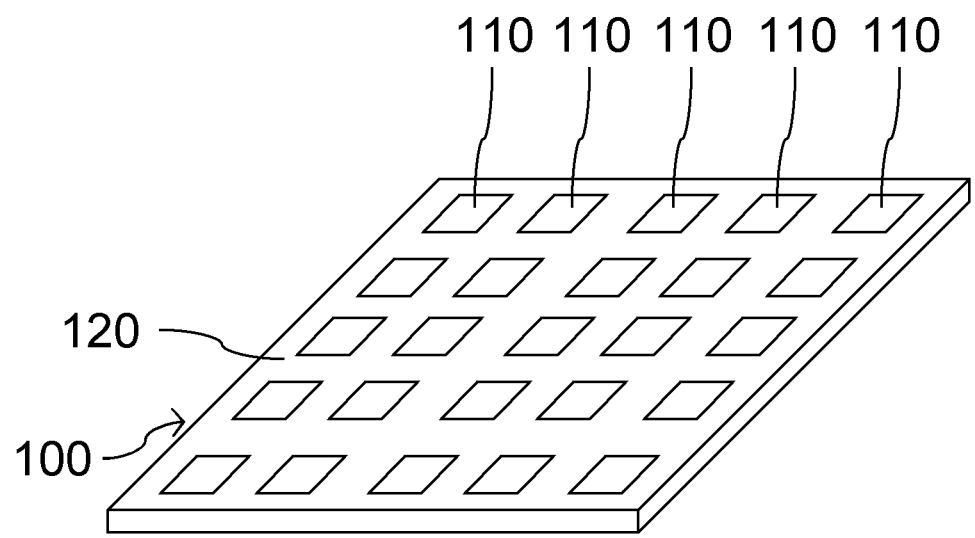
FIG. 6A shows one step of the method for disposing the photoelectric conversion element 400 on the reverse surface of the condenser lens 100 according to the present embodiment.
Figure 6B:
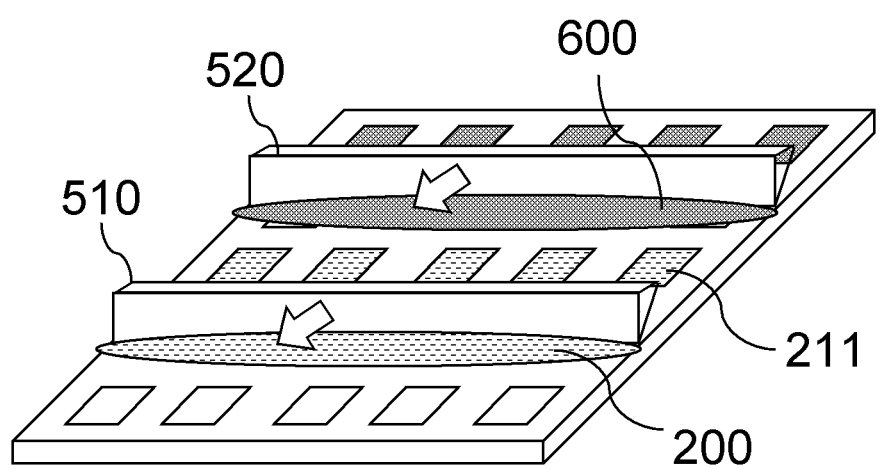
FIG. 6B shows one step of the method for disposing the photoelectric conversion element 400 on the reverse surface of the condenser lens 100 according to the present embodiment, subsequent to the step shown in FIG. 6A.

First, in the step I1, a first liquid 200 is applied to the reverse surface of the condenser lens 100, as shown in FIG. 6B. The reverse surface of the condenser lens 100 is subjected to the first liquid 200 with a first squeegee 510. In this way, the first liquid 200 is disposed on the hydrophilic region 110. The reference sign 211 indicates the first liquid 200 which has been disposed on the hydrophilic region 110.

Since the hydrophilic region 110 is surrounded by the water-repellent region 120, the hydrophilic first liquid 211 (preferably, water) which has been disposed on the hydrophilic region 110 does not leak from the hydrophilic region 110.

Instead of the use of the squeegee 510, the first liquid 200 may be disposed at one end of the reverse surface of the condenser lens 100 in the step I. Then, the condenser lens 100 may be inclined to dispose the first liquid 200 on the hydrophilic region 110.

(Step I2)

In the step I2, the first liquid 211 which has been disposed in the hydrophilic region 110 is brought into contact with the element-dispersing liquid 600. The element-dispersing liquid 600 contains the photoelectric conversion element 400. Preferably, the element-dispersing liquid 600 contains a plurality of the photoelectric conversion elements 400. The element-dispersing liquid 600 and the photoelectric conversion element 400 are described later in more detail.

Figure 7A:
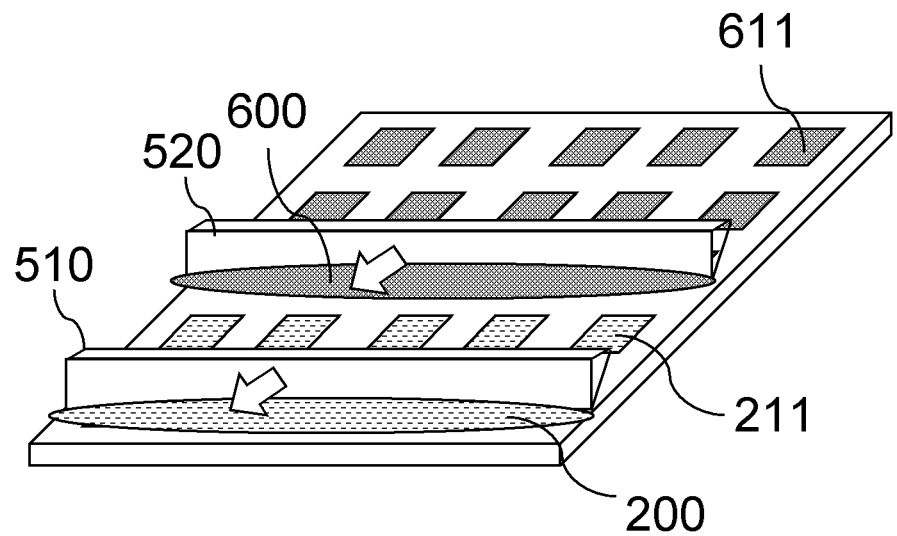
FIG. 7A shows one step of the method for disposing the photoelectric conversion element 400 on the reverse surface of the condenser lens 100 according to the present embodiment, subsequent to the step shown in FIG. 6B.
Figure 7B:
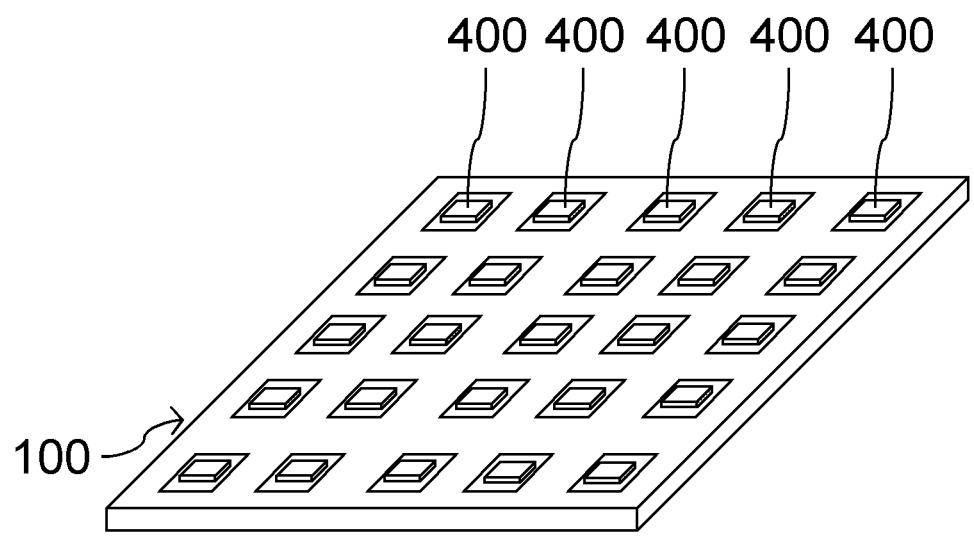
FIG. 7B shows the reverse surface of the condenser lens 100 where the photoelectric conversion elements 400 have been disposed.

More particularly, as shown in FIG. 7A and FIG. 7B, the reverse surface of the condenser lens 100 is subjected to the element-dispersing liquid 600 using the second squeegee 520. Preferably, the first squeegee 510 and the second squeegee 520 move over the reverse surface of the condenser lens 100 while maintaining the distance therebetween. The means for fixing and driving the squeegees is not illustrated. Instead of the use of the second squeegee 520, the condenser lens 100 may be immersed in the element-dispersing liquid 600 to expose the condenser lens 100 to the element-dispersing liquid 600 after the step I1.

Since the first liquid 200 (preferably, water) is not substantially dissolved in the second liquid 300, the first liquid 211 is remained stably on the hydrophilic region 110. The photoelectric conversion element 400 is moved to the inside of the first liquid 211 (preferably, water) which has been disposed in the hydrophilic region 110 by the interfacial tension that acts on the photoelectric conversion element 400. Alternatively, the photoelectric conversion element 400 is moved to the interface formed between the second liquid 300 and the first liquid 211 (preferably, water).

In FIG. 6B and FIG. 7A, while the first squeegee 510 and the second squeegee 520 move, the condenser lens 100 does not move. Instead of this, while neither the first squeegee 510 nor the second squeegee 520 moves, the condenser lens 100 moves. Alternatively, the first squeegee 510 and the second squeegee 520 move, and the condenser lens 100 also moves. These are referred to as "relative move" correctively in the instant specification. In other words, the sentence "the squeegee relatively moves over the condenser lens 100" includes the following three embodiments (a) to (c):

(a) the first squeegee 510 and the second squeegee 520 move, however, the condenser lens 100 does not move, (b) neither the first squeegee 510 nor the second squeegee 520 moves, however, the condenser lens 100 moves, and (c) the first squeegee 510, the second squeegee 520, and the condenser lens 100 move.

(Photoelectric Conversion Element 400)

Here, the photoelectric conversion element 400 is described in more detail. See FIG. 3 and the description thereof in Patent Literature 3, if necessary.

An example of the material of the photoelectric conversion element 400 is group IV semiconductor, group III-group V compound semiconductor, group II-group VI compound semiconductor, or the combination thereof. More particularly, the example of the material of the photoelectric conversion element 400 is Si, GaAs, InGaP, AlInGaAs, AlGaAs, InGaAs, InGaAsN, Ge, CuInGaSe, CdTe, or the combination thereof. GaAs is preferable.

The photoelectric conversion element 400 may be a single-junction cell or a multi-junction cell.

Preferably, the photoelectric conversion element 400 is rectangular. It is preferable that the length of one side of the photoelectric conversion element 400 is fallen within the range of not less than 50 micrometers and not more than 1,000 micrometers. More preferably, the length is fallen within the range of not less than 100 micrometers and not more than 600 micrometers.

The surface of the photoelectric conversion element 400 can be provided with an anti-reflection coating. The anti-reflection coating prevents sunlight from reflecting on the surface of the photoelectric conversion element 400. An example of the anti-reflection coating is inorganic film such as silicon oxide, silicon nitride, or magnesium fluoride. Two or more inorganic films may be used for the anti-reflection coating. Furthermore, an ultraviolet-rays reflecting film or an infrared reflecting film capable of reflecting the light having a wavelength range which the photoelectric conversion element 400 cannot absorb may be used.

Here, a method for fabricating the photoelectric conversion element 400 is described with reference to FIG. 4A to FIG. 4G.

Figure 4A:
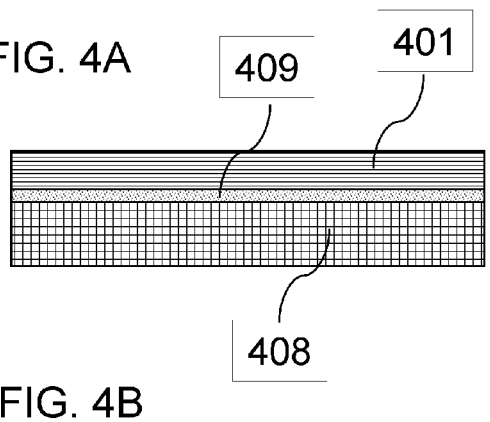
FIG. 4A shows one step of a method for fabricating a photoelectric conversion element 400 according to the present embodiment.

As shown in FIG. 4A, a sacrifice layer 409 and a power generation layer 401 are grown in this order on a surface of a GaAs substrate 408 with a conventional semiconductor growth method. An example of the conventional semiconductor growth method is a molecular beam epitaxy method or a metalorganic chemical vapor deposition method (hereinafter, referred to as "MOCVD"). The sacrifice layer 409 has a lattice constant close to that of GaAs. The sacrifice layer 409 is etched selectively with respect to GaAs. An example of the material of the sacrifice layer 409 is AlAs.

Figure 4B:
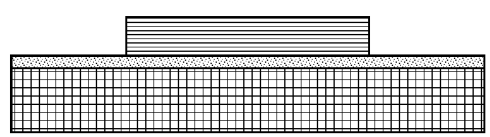
FIG. 4B shows one step of the method for fabricating the photoelectric conversion element 400 according to the present embodiment, subsequent to the step shown in FIG. 4A.

Then, as shown in FIG. 4B, a part of the power generation layer 401 is dry-etched. For the dry etching, a $Cl_2$ gas may be used. Instead of this, a gaseous mixture of $BCl_3$ and $SF_6$ may be used.

Figure 4C:
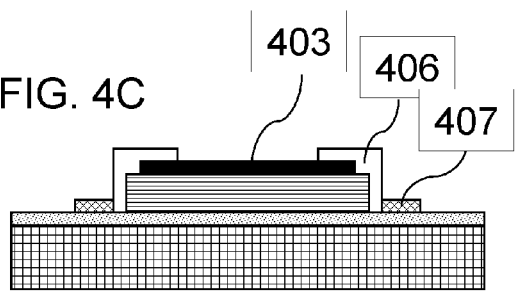
FIG. 4C shows one step of the method for fabricating the photoelectric conversion element 400 according to the present embodiment, subsequent to the step shown in FIG. 4B.

As shown in FIG. 4C, a first electrode 403, an isolation film 406, and a connecting electrode 407 are formed. The first electrode 403 and the connecting electrode 407 may be formed by a sputtering method or by an electron beam evaporation method. The isolation film 406 may be formed by a chemical vapor growth method.

An example of the material of the isolation film 406 is non-doped InGaP, silicon dioxide, or silicon nitride.

The material of the connecting electrode 407 is not limited, as far as an ohmic contact is formed between the second electrode 402 and the first metal plating 404, which are described later. An example of the material of the connecting electrode 407 is Ti or Al.

Figure 4D:
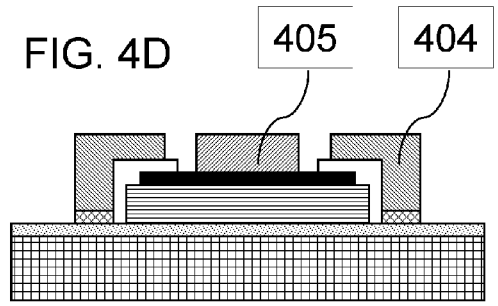
FIG. 4D shows one step of the method for fabricating the photoelectric conversion element 400 according to the present embodiment, subsequent to the step shown in FIG. 4C.

As shown in FIG. 4D, the first metal plating 404 and the second metal plating 405 are grown by a non-electrolytic plating method or by an electrolytic plating method.

Figure 4E:
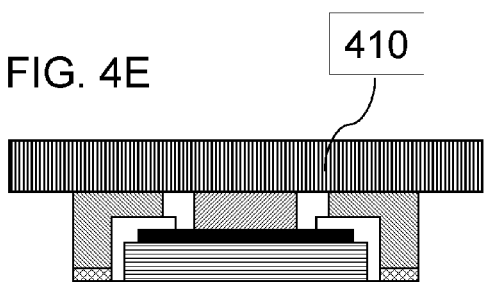
FIG. 4E shows one step of the method for fabricating the photoelectric conversion element 400 according to the present embodiment, subsequent to the step shown in FIG. 4D.

As shown in FIG. 4E, a supporting substrate 410 is fixed on the first metal plating 404 and the second metal plating 405. Subsequently, the GaAs substrate 408 and the sacrifice layer 409 are removed by etching. An example of the supporting substrate 410 is a silicon substrate or a glass substrate. Wax or an adhesion sheet may be interposed between the first metal plating 404 and the supporting substrate 410, when needed. Similarly, wax or an adhesion sheet may be interposed between the second metal plating 405 and the supporting substrate 410, when needed.

Figure 4F:
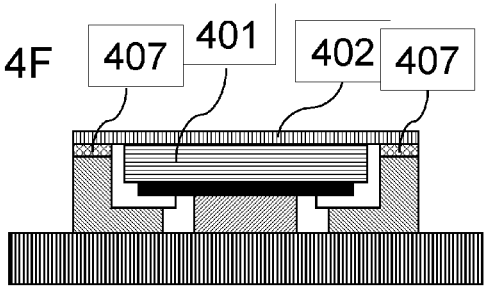
FIG. 4F shows one step of the method for fabricating the photoelectric conversion element 400 according to the present embodiment, subsequent to the step shown in FIG. 4E.

As shown in FIG. 4F, the second electrode 402 is formed on the power generation layer 401 and on the connecting electrode 407 by a sputtering method or by an electron beam evaporation method. In this way, the power generation layer 401 is electrically connected to the connecting electrode 407 through the second electrode 402.

Figure 4G:
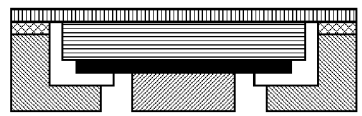
FIG. 4G shows one step of the method for fabricating the photoelectric conversion element 400 according to the present embodiment, subsequent to the step shown in FIG. 4F.

Finally, as shown in FIG. 4G, the supporting substrate 410 is removed. In this way, the photoelectric conversion element 400 is obtained.

When a liquid having a greater polarity such as water is used as the first liquid 200, it is desirable that the photoelectric conversion element 400 has a high surface energy. More particularly, the surface energy is 40 $mJ/m^2$ or more.

When the photoelectric conversion element 400 has a small surface energy, it is preferable that the surface energy of the photoelectric conversion element 400 is increased. When the photoelectric conversion element 400 has silicon on the surface thereof, the surface of photoelectric conversion element 400 is irradiated with ultraviolet rays under an ozone atmosphere to increase the surface energy.

A thin film having an affinity to the first liquid 200 may be formed on the surface of the photoelectric conversion element 400 to increase the surface energy of the photoelectric conversion element 400. When the first liquid 200 is water, an example of this film is a hydrophilic film. For example, a hydrophilic film formed of silicon oxide, silicon nitride, or titanium oxide may be formed on the surface of the photoelectric conversion element 400 by a vacuum sputtering method or by a thermal CVD method. After the hydrophilic film is formed, the surface of the photoelectric conversion element 400 may be irradiated with ultra-violet rays under an ozone atmosphere. The surface of the photoelectric conversion element 400 is modified with a silane coupling agent having an amino group, a carboxyl group, or a hydroxyl group at the end thereof to increase the surface energy of the photoelectric conversion element 400. When the surface of the photoelectric conversion element 400 has metal, the surface may be modified with a thiol group having an amino group, a carboxyl group, or a hydroxyl group at the end thereof.

(Element-Dispersing Liquid 600)

Figure 5:
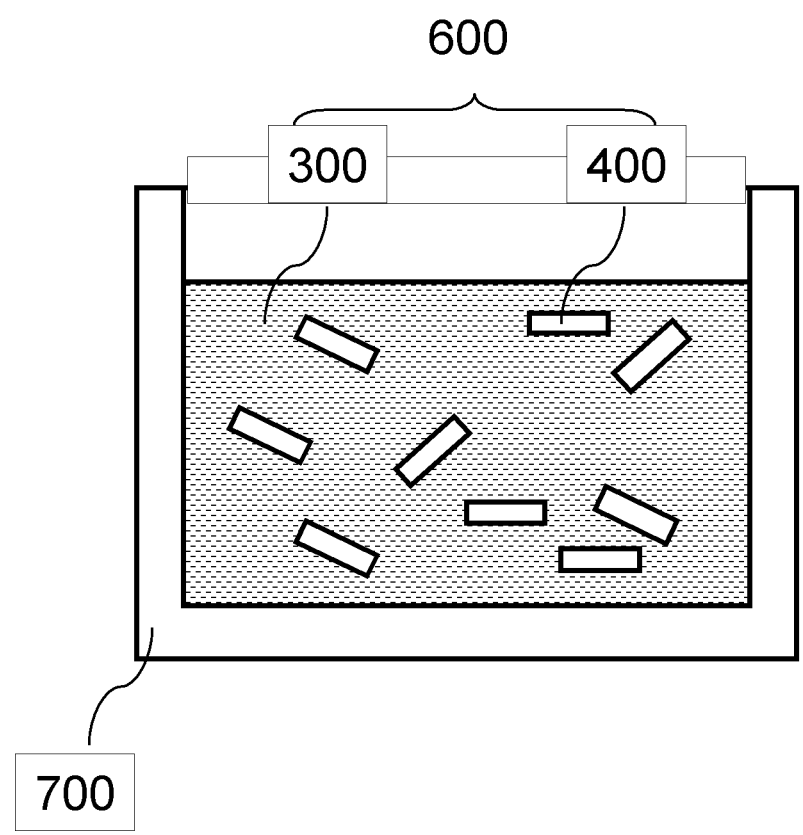
FIG. 5 shows an element-dispersing liquid 600 containing the photoelectric conversion element 400.

The element-dispersing liquid 600 contains the photoelectric conversion elements 400 and a second liquid 300. FIG. 5 shows the element-dispersing liquid 600 contained in a container 700 schematically. The element-dispersing liquid 600 contains the second liquid 300 and the photoelectric conversion elements 400. The photoelectric conversion elements 400 are dispersed in the second liquid 300. Water is substantially insoluble in the second liquid 300. An example of the second liquid 300 is hexane. Another specific example of the second liquid 300 is described later. The term "dispersion" used in the instant specification means the state that the photoelectric conversion element 400 is not agglutinated in the second liquid 300. In order to disperse the photoelectric conversion elements 400, the element-dispersing liquid 600 may be stirred.

The first liquid 200 and the second liquid 300 may be appropriately selected in light of the interfacial tension that acts at the interface between the first liquid 200 and the second liquid 300 and in light of the wettabilities of the surface of the photoelectric conversion element 400 with respect to the first liquid 200 and the second liquid 300.

The first liquid 200 is required not to be substantially dissolved in the second liquid 300. Since the first liquid 200 is not substantially dissolved in the second liquid 300, the first liquid 200 stays stably on the hydrophilic region 111 when the first liquid 200 is brought into contact with the second liquid 300. The photoelectric conversion element 400 is moved in the inside of the first liquid 200 by an interfacial tension. The phrase "substantially insoluble" means that the solubility defined by the weight of the first liquid dissolved in 100 ml of the second liquid is 10 grams or less, and more preferably 1 gram or less.

A combination of the first liquid 200 and the second liquid 300 is, for example, a combination of a liquid with high polarity as the first liquid 200 and a liquid having lower polarity than that of the first liquid 200 as the second liquid 300. In other words, the first liquid 200 is hydrophilic, and the second liquid 300 is hydrophobic.

An example of the first liquid 200 is water. Instead of water, alcohols such as methanol, ethanol, ethylene glycol, or glycerine, and a mixture of such an alcohol and water can be used. Water is more suitable since it has a high surface tension and therefore enables the photoelectric conversion element 400 to be held firmly in the hydrophilic region 110.

An example of the second liquid 300 is alkanes such as hexane, heptane, octane, nonane, decane, undecane, dodecane, tridecane, tetradecane, pentadecane, or hexadecane;

aromatic hydrocarbons such as toluene, benzene, or xylene;

chlorinated solvents such as chloromethane, dichloromethane, chloroform, carbon tetrachloride, monochlorobutane, dichlorobutane, monochloropentane, or dichloropentane;

ethers such as diethyl ether orpetroleum ether;

esters such as ethyl acetate or butyl acetate;

silicone oil;

perfluorooctane;

perfluorononane; or a mixture of these.

(Step I3)

Finally, the step I3 is described. The first liquid 211 (preferably water) and the second liquid 300 are removed from the condenser lens 100 to dispose the photoelectric conversion element 400 on the hydrophilic region 110, as shown in FIG. 7B. A suitable drying method can be selected from well-known drying methods such as natural drying, drying in a vacuum desiccator, drying by blowing air or gas, or drying by heating and/or under reduced pressure. Before drying, the substrate 100 may be washed.

In this way, the photoelectric conversion element 400 is disposed accurately on the focal point of the condenser lens 100 to obtain the solar cell.

The solar cell device comprises the solar cell thus obtained.

Figure 8:
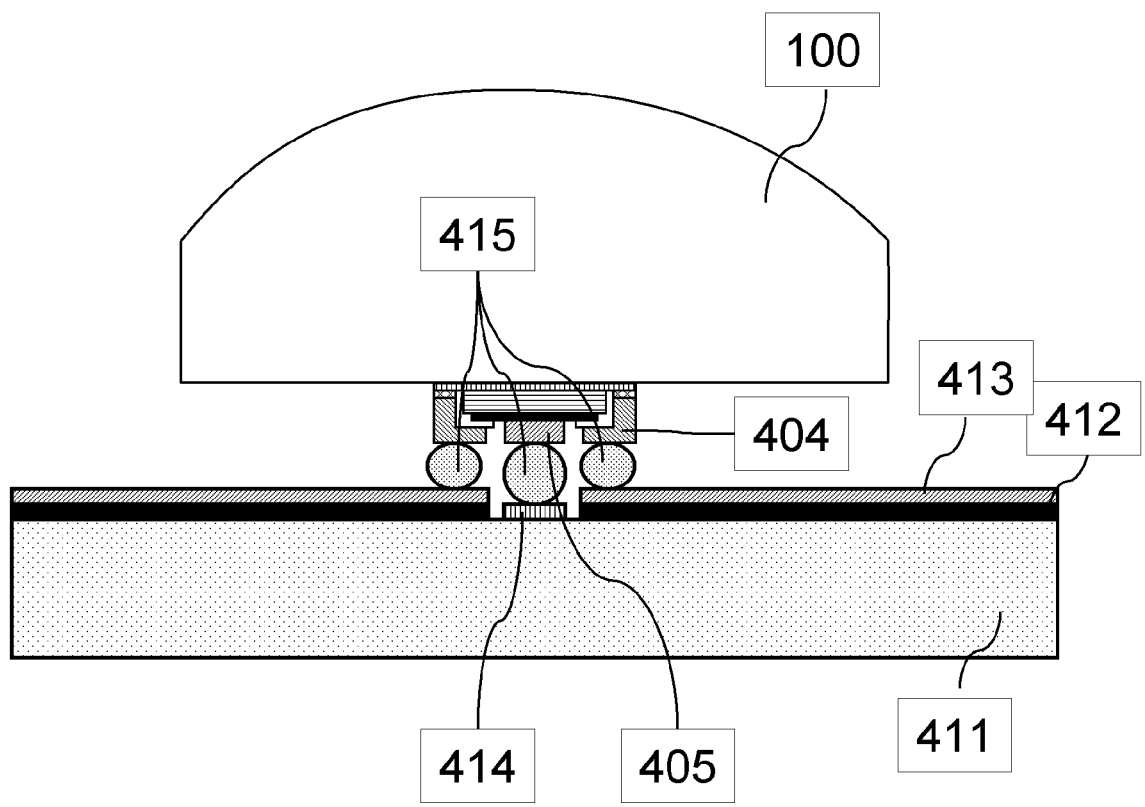
FIG. 8 shows a cross-sectional view of a solar cell according to the present embodiment.
Figure 9:
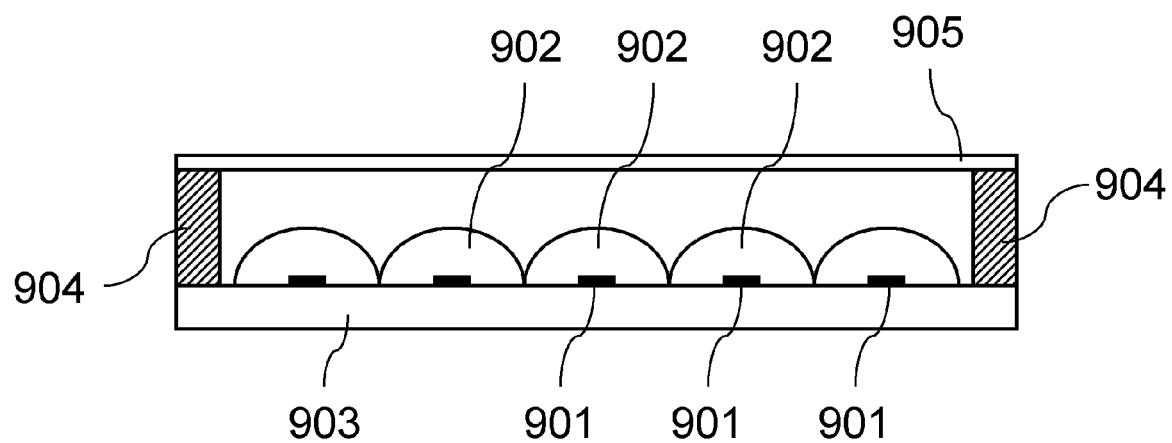
FIG. 9 shows a cross-sectional view of the solar cell disclosed in Patent Literature 1.
Figure 10A:
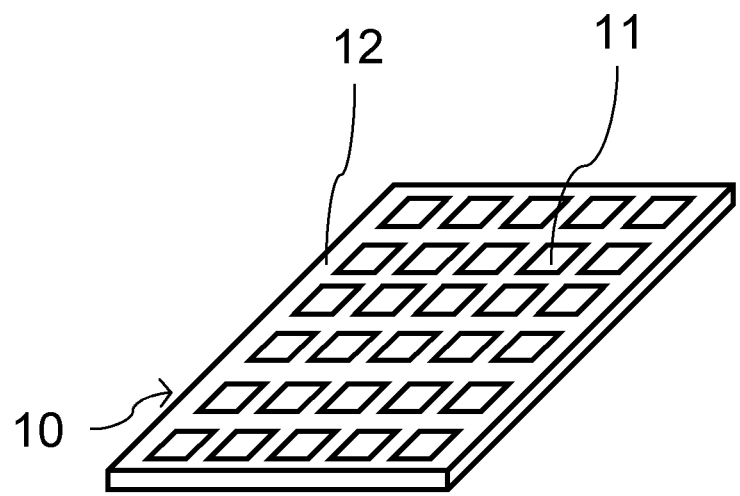
FIG. 10A shows one step of the method for disposing the element; the method being disclosed in Patent Literature 2.
Figure 10B:
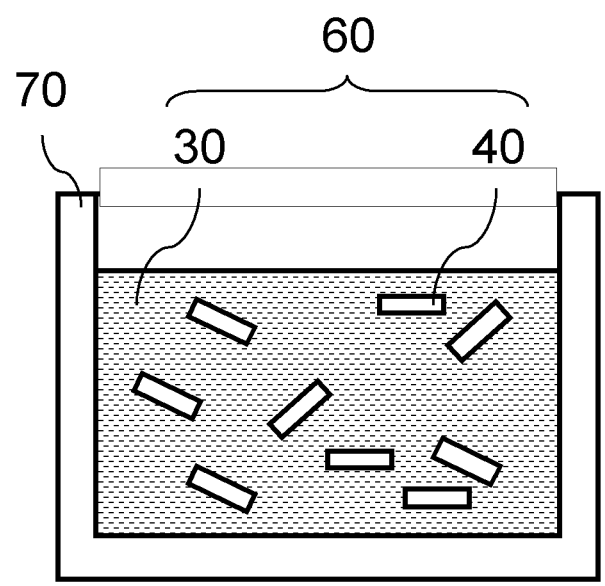
FIG. 10B shows the element-containing liquid 60 disclosed in Patent Literature 2.
Figure 11A:
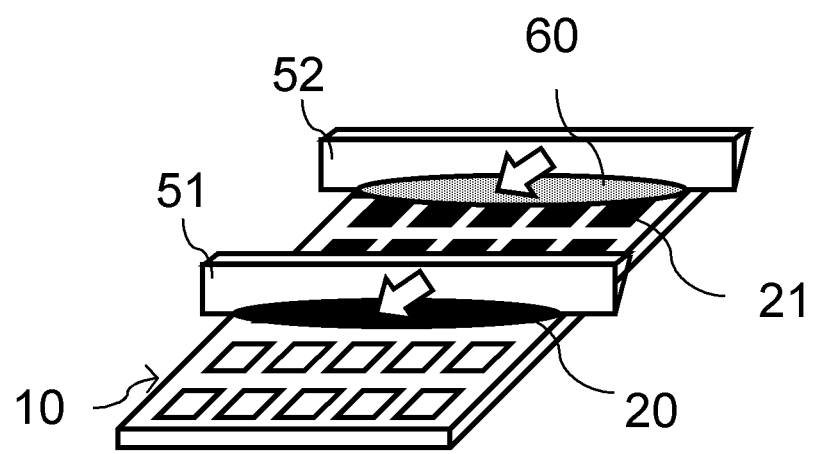
FIG. 11A shows one step of the method for disposing the element, subsequent to the step shown in FIG. 10A; the method being disclosed in Patent Literature 2.
Figure 11B:
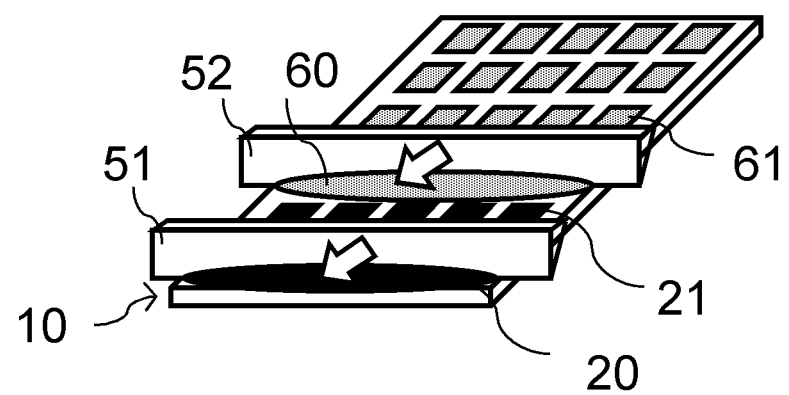
FIG. 11B shows one step of the method for disposing the element, subsequent to the step shown in FIG. 11A; the method being disclosed in Patent Literature 2.

FIG. 8 shows a cross-sectional view of the solar cell device. A first electric wiring 413 and a second electric wiring 414 are formed on a cooling plate 411. An isolation film 412 is interposed between the first electric wiring 413 and the cooling plate 411. The first electric wiring 413 is electrically connected to the first metal plating 404 through a conductive material 415. The second electric wiring 414 is electrically connected to the second metal plating 405 through the conductive material 415.

The first electric wiring 413 and the second electric wiring 414 can be formed by a sputter deposition method or by an electron beam evaporation method, after an resist pattern is formed by photolithography.

An example of the material of the isolation film 412 is an epoxy resin. The epoxy resin may be applied to the cooling plate 413 to form the flat isolation film 412.

An example of the conductive material 415 is an electrically-conductive paste containing particles made of gold or silver, a solder such as SnAgCu or SnZnBi, an anisotropic electrically-conductive film, or an anisotrop ic electrically-conductive paste.

As described above, the photoelectric conversion element 400 is electrically connected to the first electric wiring 413 and the second electric wiring 414. The photoelectric conversion element 400 is fixed between the cooling plate 411 and the condenser lens 100. In this way, the solar cell device is obtained.

EXAMPLES

The following examples describe a method for disposing the photoelectric conversion element 400 accurately on the focal point of the condenser lens 100 in more detail.

Example 1

In the example 1, the photoelectric conversion element 400 was disposed on the focal point of the condenser lens 100. Plate-like GaAs elements were used for the photoelectric conversion elements 400.

<Fabrication of the Condenser Lens 100>

The material of the condenser lens 100 used in this example 1 was polymethylmethacrylate. The condenser lens 100 was fabricated by an mold injection method. As shown in FIG. 1A, the condenser lens 100 comprised 25 (=5×5) optical lenses. Each lens was 10 millimeters square and had a thickness of approximately 17 millimeters. Each lens had a focal point of 0.4 millimeter square on the reverse surface thereof. In order to evaluate the disposing accuracy of the photoelectric conversion element 400, the coordinate of the focal point of the condenser lens 100 was measured beforehand.

First, a plurality of hydrophilic regions 110 surrounded by the water-repellent region 120 were formed on the reverse surface of the condenser lens 100 as below.

Under a drying atmosphere, the condenser lens 100 was immersed for 60 minutes in a mixture of chloroform/hexadecane (volume ratio: 1:4) containing $CH_3(CH_2)_7SiCl_3$ (hereinafter, referred to as "OTS") having a concentration of 1% by volume. Subsequently, the condenser lens 100 was washed in a mixture of chloroform/hexadecane (volume ratio: 1:4). Furthermore, the condenser lens 100 was washed in isopropanol. Then, the solvent was removed. In this way, both of the obverse and reverse surfaces of the condenser lens 100 were covered by a OTS film, as shown in FIG. 2B. The static contact angle at the reverse surface of the condenser lens 100 with respect to pure water was 102 degrees.

Subsequently, the condenser lens 100 was fixed with a jig. Then, only the reverse surface of the condenser lens 100 was subjected to a plasma treatment under an oxygen atmosphere so as to remove a part of the OTS film which had covered the reverse surface of the condenser lens 100. In this way, the reverse surface of the condenser lens 100 was caused to be hydrophilic. At this point, the static contact angle at the reverse surface of the condenser lens 100 with respect to pure water was 26 degrees.

Then, the condenser lens 100 was immersed in a perfluorooctane solution containing $CF_3(CF_2)_7C_2H_4SiCl_3$ (hereinafter, referred to as "FS-17") having a concentration of 1% by volume under a drying atmosphere for 20 minutes. Subsequently, the condenser lens 100 was washed in pure perfluorooctane. Then, the solvent was removed. In this way, the reverse surface of the condenser lens 100 was coated with an FS-17 film, as shown in FIG. 2D. At this point, the static contact angle at the reverse surface of the condenser lens 100 with respect to pure water was 107 degrees.

Then, the condenser lens 100 was immersed in a toluene solution containing $NH_2(CH_2)_3Si(OCH_3)$ (hereinafter, referred to as "APTMS") having a concentration of 1% by volume under a drying atmosphere for 120 minutes. Subsequently, the condenser lens 100 was washed in pure toluene. Then, the solvent was removed. In this way, an APTMS film was further laminated on the FS-17 film (see the referential sign of 802) which coated the reverse surface of the condenser lens 100. At this point, the static contact angle at the reverse surface of the condenser lens 100 with respect to pure water was 61 degrees.

Subsequently, as shown in FIG. 3A, the positive photoresist 804 was formed on the reverse surface of the condenser lens 100. Then, as shown in FIG. 3B, the obverse surface of the condenser lens 100 was irradiated with light using an exposure machine. The light travelling towards the condenser lens 100 was converged by the condenser lens 100, and only a part of the positive photoresist 804 located at the focal point of the condenser lens 100 was irradiated with the light. Subsequently, the condenser lens 100 was immersed in the developing liquid containing tetramethylammonium hydroxide so as to form the openings 806 in the photoresist 804, as shown in FIG. 3C.

Subsequently, the condenser lens 100 was fixed with a jig. Only the reverse surface of the condenser lens 100 was subjected to a plasma treatment under an oxygen atmosphere so as to remove the part of the APTMS film which had been coated the focal point of the condenser lens 100. At the same time, as shown in FIG. 3D, the part of the OTS film which had been coated the focal point of the condenser lens 100 was removed. Finally, the photoresist 804 was removed with N-methylpyrrolidone, as shown in FIG. 3E.

In this way, the hydrophilic regions 110 surrounded by the water-repellent region 120 were formed on the reverse surface of the condenser lens 100.

(Preparation of Element-dispersing Liquid 600)

The element-dispersing liquid 600 which contained the photoelectric conversion elements 400 (plate-like GaAs elements, in the present example) was prepared as below.

First, an AlAs film having a thickness of 100 nm was formed on the surface of a GaAs substrate having a thickness of 450 μm by a MOCVD method. Subsequently, a GaAs film having a thickness of 5 μm was formed. Then, a Ti/Au film of 130 μm square was formed on the surface of the GaAs film by a lift-off method using a resist pattern. The Ti film had a thickness of 50 nm. The Au film had a thickness of 150 nm.

Then, a part of the GaAs film was removed by a wet etching method using the resist pattern as a mask. The resist pattern was removed by N-methylpyrrolidone, acetone, and isopropanol so as to form a plurality of plate-like GaAs elements. Each plate-like GaAs element had a length of 150 μm, a width of 150 μm, and a height of 5.2 μm. Subsequently, the AlAs film was etched with hydrochloric acid having a concentration of 1 mol/L under a temperature of 50 degrees Celsius so as to lift-off the plate-like GaAs elements.

Then, the plate-like GaAs elements dispersed in the hydrochloric acid aqueous solution were suction-filtrated using a filter. The filter where the plate-like GaAs elements were attached was washed several times in pure water. Subsequently, the filter was immersed in 1,4-dichlorobutane. The plate-like GaAs elements attached to the filter were dispersed in the 1,4-dichlorobutane. In this way, the element-dispersing liquid 600 was prepared.

Then, as shown in FIG. 6A to FIG. 7B, the photoelectric conversion elements 400 contained in the element-dispersing liquid 600 were disposed on the reverse surface of the condenser lens 100.

The first squeegee 510 comprised a slit having a length of 20 mm and a width of width of 0.5 mm at the bottom surface thereof. In order to hold water stably, a piece of cotton including water was put in the slit.

The second squeegee 520 was a knife made of polyethylene.

As shown in FIG. 6B, the first squeegee 510 and the second squeegee 520 were located at the one end side of the reverse surface of the condenser lens 100. The element-dispersing liquid 600 having a volume of approximately 50 μL was disposed in front of the second squeegee 520 with a pipette. The distance formed between the bottom surface of the first squeegee 510 and the reverse surface of the condenser lens 100 was maintained at approximately 0.2 mm. The distance formed between the bottom surface of the second squeegee 520 and the reverse surface of the condenser lens 100 was also maintained at approximately 0.2 mm. The distance formed between the first squeegee 510 and the second squeegee 520 was maintained at approximately 1 mm.

The first squeegee 510 and the second squeegee 520 were moved at a rate of 10 mm/second. This operation was repeated five times.

(Accuracy Evaluation Method)

The disposing accuracy of the photoelectric conversion element 400 was evaluated by the following method. The disposition state of the plate-like GaAs element 400 on the reverse surface of the condenser lens 100 was observed with a microscope. More particularly, measured were the coordinates of the center positions of the plate-like GaAs elements 400 located on the twenty-five hydrophilic regions 110 formed on the reverse surface of the condenser lens 100.

When the distance formed between the coordinate of the center position of the disposed plate-like GaAs element 400 and the coordinate of the focal point of the condenser lens 100 beforehand measured was smaller than 50 μm, the result was evaluated as "Good". When the distance was 50 μm or more, the result was evaluated as "Poor". The term "OK" described in the column of the accuracy evaluation in Table 1 means that all of the twenty-five results were "Good". The term "NG" means that the twenty-five results included one or more "Poor".

(Foreign Object Evaluation Method)

An adhesion state of foreign objects in the obverse surface of the condenser lens 100 was observed with a microscope. An example of the foreign object was a resist. More particularly, the obverse surface of the condenser lens 100 was observed with a microscope, and the number of the attached foreign objects was counted. The term "OK" described in the column of the foreign object evaluation in Table 1 means that the adhesion of the foreign objects was not observed. The term "NG" means that the adhesion of the foreign objects was observed.

Example 2

An experiment similar to the example 1 was conducted, except that $CF_3CH_2CH_2SiCl_3$ (hereinafter, referred to as "FS-3") was used instead of the FS-17.

Comparative Example 1

In the comparative example 1, an experiment similar to the example 1 was conducted, except that the OTS was not used.

Comparative Example 2

In the comparative example 2, an experiment similar to the example 1 was performed, except that neither the OTS nor the APTMS was used.

Comparative Example 3

In the comparative example 3, an experiment similar to the example 1 was performed, except that the APTMS was not used.

Comparative Example 4

In the comparative example 4, an experiment similar to the example 1 was performed, except that the FS-17 was used instead of the OTS.

Comparative Example 5

In the comparative example 5, an experiment similar to the example 1 was performed, except that the OTS was used instead of the FS-17.

Table 1 shows the results of the disposing accuracy evaluation and the foreign object evaluation in the examples 1 to 2 and in the comparative examples 1 to 5.

TABLE 1

| | Film 801 | Film 802 | Film 803 | Disposing accuracy evaluation | Foreign object evaluation | Remarks |
|---|---|---|---|---|---|---|
| Example 1 | OTS | FS-17 | APTMS | OK | OK | |
| Example 2 | OTS | FS-3 | APTMS | OK | OK | |
| Comparative example 1 | Not formed | FS-17 | APTMS | OK | NG | |
| Comparative example 2 | Not formed | FS-17 | Not formed | — | NG | The resist was not applied |
| Comparative example 3 | OTS | FS-17 | Not formed | — | OK | The resist was not applied |
| Comparative example 4 | FS-17 | FS-17 | APTMS | OK | NG | |
| Comparative example 5 | OTS | OTS | APTMS | — | OK | The resist was not applied |

As is clear from Table 1, both of the disposing accuracy evaluation and the foreign object evaluation were good in the example 1 and the example 2.

On the contrary, in the comparative examples 2, 3, and 5, the photoresist 804 was not able to be applied to the reverse surface of the condenser lens 100. In the comparative example 1, 2, and 4, the adhesion of the foreign object was observed in the obverse surface of the condenser lens 100.

The method according to the present embodiment allows the photoelectric conversion element 400 to be disposed accurately on the focal point of the condenser lens 100. Furthermore, no foreign object was attached on the obverse surface of the condenser lens 100.

Industrial Applicability

The solar cell provided in accordance with the present embodiment can be used for the solar cell device.

Reference Mark in the Drawings

| | |
|---|---|
| 100 | condenser lens |
| 110 | hydrophilic region |
| 120 | water-repellent region |
| 200 | first liquid (preferably, water) |
| 211 | first liquid disposed on the hydrophilic region 110 |
| 300 | second liquid |
| 400 | photoelectric conversion element |
| 401 | power generation layer |
| 402 | first electrode |
| 403 | second electrode |
| 404 | first metal plating |
| 405 | second metal plating |
| 406 | isolation film |
| 407 | connecting electrode |
| 408 | substrate |
| 409 | sacrifice layer |
| 410 | supporting substrate |
| 411 | cooling plate |
| 412 | isolation film |
| 413 | first electric wiring |
| 414 | second electric wiring |
| 415 | conductive material |
| 510 | first squeegee |
| 520 | second squeegee |
| 600 | element-dispersing liquid |
| 611 | element-dispersing liquid disposed on the hydrophilic region 110 |
| 700 | container |
| 801 | alkylsilane film |
| 802 | fluoroalkylsilane film |
| 803 | aminoalkylsilane film |
| 805 | light travelling toward the condenser lens 100 |

The invention claimed is:

1. A method for fabricating a solar cell comprising a condenser lens and a photoelectric conversion element, the method comprising steps of:
    a step (a) of preparing the condenser lens comprising a convex part on the obverse surface thereof and a flat reverse surface;

a step (b) of forming an alkylsilane film on the obverse surface of the condenser lens and forming a fluoroalkylsilane film on the reverse surface of the condenser lens;

a step (c) of immersing the condenser lens in a solution containing aminoalkylsilane to form an aminoalkylsilane film on the fluoroalkylsilane film; wherein the aminoalkylsilane film is not formed on the alkylsilane film;

a step (d) of forming a photoresist on the aminoalkylsilane film;

a step (e) of irradiating the obverse surface of the condenser lens with light to expose a part of the photoresist located at a focal point on the photoresist to light through a focal point on the reverse surface of the condenser lens, a focal point on the fluoroalkylsilane film, and a focal point on the aminoalkylsilane film;

a step (f) of removing the exposed part of the photoresist to form a opening where the focal point of the aminoalkylsilane film is exposed;

a step (g) of removing a part of the aminoalkylsilane film located at the focal point of the aminoalkylsilane film and a part of the fluoroalkylsilane film located at the focal point of the fluoroalkylsilane film by an oxygen plasma treatment or an ozone plasma treatment through the opening so as to cause the focal point on the reverse surface of the condenser lens to be a hydrophilic region;

a step (h) of removing the remained photoresist to obtain the condenser lens having the reverse surface where the hydrophilic region is surrounded by a water-repellent region formed of the fluoroalkylsilane film; and a step (i) of disposing the photoelectric conversion element on the hydrophilic region to obtain the solar cell comprising the condenser lens and the photoelectric conversion element.

2. The method according to claim 1, wherein
in the step (i), the photoelectric conversion element is disposed on the photoelectric conversion element with an automatic mounting machine.

3. The method according to claim 1, wherein
the step (i) comprises the following three steps (i1) to (i3):

a step (i1) of bringing a first liquid into contact with the reverse surface of the condenser lens obtained in the step (h) to dispose the first liquid on the hydrophilic region; wherein the first liquid is not disposed on the water-repellent region;

a step (i2) of bringing a second liquid into contact with the reverse surface of the condenser lens so as to move the photoelectric conversion element into the first liquid disposed on the hydrophilic region; wherein the photoelectric conversion element is dispersed in the second liquid;

the photoelectric conversion element comprises a hydrophilic surface; and the second liquid is insoluble in the first liquid; and a step (i3) of removing the first liquid and the second liquid which are disposed on the reverse surface of the condenser lens from the reverse surface of the condenser lens so as to dispose the photoelectric conversion element on the focal point of the reverse surface of the condenser lens.

4. The method according to claim 3, wherein
the first liquid is hydrophilic, and the second liquid is hydrophobic.

5. The method according to claim 4, wherein
the first liquid is water.

6. The method according to claim 4, wherein
the second liquid is a chlorinated solvent.

7. The method according to claim 4, wherein
the first liquid is water, and the second liquid is a chlorinated solvent.

8. A method for fabricating a condenser lens, the method comprising steps of:

a step (a) of preparing the condenser lens comprising a convex part on the obverse surface thereof and a flat reverse surface;

a step (b) of forming an alkylsilane film on the obverse surface of the condenser lens and forming a fluoroalkylsilane film on the reverse surface of the condenser lens;

a step (c) of immersing the condenser lens in a solution containing aminoalkylsilane to form an aminoalkylsilane film on the fluoroalkylsilane film; wherein the aminoalkylsilane film is not formed on the alkylsilane film;

a step (d) of forming a photoresist on the aminoalkylsilane film;

a step (e) of irradiating the obverse surface of the condenser lens with light to expose a part of the photoresist located at a focal point on the photoresist to light through a focal point on the reverse surface of the condenser lens, a focal point on the fluoroalkylsilane film, and a focal point on the aminoalkylsilane film;

a step (f) of removing the exposed part of the photoresist to form an opening where the focal point of the aminoalkylsilane film is exposed;

a step (g) of removing a part of the aminoalkylsilane film located at the focal point of the aminoalkylsilane film and a part of the fluoroalkylsilane film located at the focal point of the fluoroalkylsilane film by an oxygen plasma treatment or an ozone plasma treatment through the opening so as to cause the focal point on the reverse surface of the condenser lens to be a hydrophilic region; and a step (h) of removing the remained photoresist to obtain the condenser lens having the reverse surface where the hydrophilic region is surrounded by a water-repellent region formed of the fluoroalkylsilane film.

* * * * *